(12) United States Patent
Weng

(10) Patent No.: US 12,204,841 B2
(45) Date of Patent: Jan. 21, 2025

(54) MODELING METHOD AND APPARATUS, COMPUTER DEVICE AND STORAGE MEDIUM

(71) Applicant: CHANGXIN MEMORY TECHNOLOGIES, INC., Hefei (CN)

(72) Inventor: Kun Weng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 524 days.

(21) Appl. No.: 17/650,862

(22) Filed: Feb. 14, 2022

(65) Prior Publication Data

US 2022/0374580 A1 Nov. 24, 2022

Related U.S. Application Data

(63) Continuation of application No. PCT/CN2021/120533, filed on Sep. 26, 2021.

(30) Foreign Application Priority Data

May 20, 2021 (CN) .......................... 202110554254.8

(51) Int. Cl.
*G06F 30/3947* (2020.01)
*H01L 23/00* (2006.01)
*H01L 23/48* (2006.01)
*H01L 25/065* (2023.01)

(52) U.S. Cl.
CPC ........ *G06F 30/3947* (2020.01); *H01L 23/481* (2013.01); *H01L 24/05* (2013.01); *H01L 25/0657* (2013.01); *H01L 2224/0401* (2013.01); *H01L 2224/05025* (2013.01); *H01L 2224/0508* (2013.01); *H01L 2224/05111* (2013.01); *H01L 2224/05139* (2013.01); *H01L 2224/05147* (2013.01); *H01L 2224/05155* (2013.01); *H01L 2225/06513* (2013.01); *H01L 2225/06541* (2013.01)

(58) Field of Classification Search
USPC ................. 716/110, 111, 113, 129, 131, 139
See application file for complete search history.

(56) References Cited

U.S. PATENT DOCUMENTS

| 8,959,009 | B1 | 2/2015 | Sercu | |
|---|---|---|---|---|
| 9,633,149 | B2 | 4/2017 | Yen | |
| 11,164,770 | B1* | 11/2021 | Or-Bach | ............. H01L 27/1203 |
| 2012/0129301 | A1* | 5/2012 | Or-Bach | ............. H10B 10/125 |
| | | | | 438/129 |
| 2013/0246990 | A1 | 9/2013 | Yen | |

(Continued)

FOREIGN PATENT DOCUMENTS

| CN | 103310070 A | 9/2013 |
|---|---|---|
| CN | 103839921 B | 6/2016 |
| CN | 103310031 B | 3/2017 |

(Continued)

*Primary Examiner* — Brian Ngo
(74) *Attorney, Agent, or Firm* — Syncoda LLC; Feng Ma

(57) ABSTRACT

A modeling method includes the following: acquiring electrical parameters of each sub-structure in a through silicon via (TSV) structure; obtaining an electrical topology network model according to a connection relationship of each TSV structure between two dies; and obtaining a simulation model for simulation based on the electrical topology network model and the electrical parameters.

20 Claims, 10 Drawing Sheets

(56) References Cited

U.S. PATENT DOCUMENTS

2018/0006006 A1* 1/2018 Kim .................. H01L 25/50
2021/0090983 A1* 3/2021 Lin .................. H01L 25/50

FOREIGN PATENT DOCUMENTS

| CN | 107564894 A | * | 1/2018 | ........... H01L 21/561 |
| CN | 109657305 A | | 4/2019 | |
| CN | 111783376 A | * | 10/2020 | ......... G06F 30/3323 |
| JP | 2014072499 A | * | 4/2014 | ........... H01L 23/481 |
| JP | 2020009992 A | * | 1/2020 | ............. G11C 16/06 |

* cited by examiner

MODELING METHOD AND APPARATUS, COMPUTER DEVICE AND STORAGE MEDIUM

CROSS-REFERENCE TO RELATED APPLICATIONS

This is a continuation of International Patent Application No. PCT/CN2021/120533 filed on Sep. 26, 2021, which claims priority to Chinese Patent Application No. 202110554254.8 filed on May 20, 2021. The disclosures of these applications are hereby incorporated by reference in their entirety.

BACKGROUND

Through silicon via (TSV) technology is a new technology solution to realize interconnection of stacked chips in three-dimensional integrated circuits. TSV technology enables electrical connection between adjacent two dies by forming a TSV structure between two adjacent semiconductor chips (also referred to as die).

For example, the TSV technology may be applied to double data rate (DDR) products of dynamic random access memory (DRAM) to superimpose two or even more DDR chips. A TSV structure may be formed between two adjacent DDR chips such that the adjacent DDR chips can be electrically connected to form a 3D stacked structure, thereby reducing additional losses due to packaging.

SUMMARY

The disclosure relates to the technical field of integrated circuits, and in particular to a modeling method and apparatus, a computer device, and a storage medium.

In one aspect, the disclosure provides a modeling method. The method includes: acquiring electrical parameters of each sub-structure in a TSV structure; obtaining an electrical topology network model according to a connection relationship of each TSV structure between two dies; and obtaining a simulation model for simulation based on the electrical topology network model and the electrical parameters.

Another aspect of the disclosure provides a modeling apparatus. The modeling apparatus includes: an acquisition circuit that is configured to acquire electrical parameters of each sub-structure in a TSV structure; an electrical topology network model processor that is configured to obtain an electrical topology network model according to a connection relationship of each TSV structure between two dies; and a simulation model processor that is configured to obtain a simulation model for simulation based on the electrical topology network model and the electrical parameters.

Yet another aspect of the disclosure provides a computer device including a memory and a processor, the memory stores a computer program, the processor implements the processes in the above method when executing the computer program.

Yet another aspect of the disclosure provides a non-transitory computer-readable storage medium having a computer program stored thereon, and the computer program implements the processes in the above method when executed by a processor.

Details in various embodiments of the disclosure will be described in the following drawings and descriptions. According to the specification, drawings and claims, other features, problems to be solved and technical effects of the disclosure will be readily understood by those skilled in the art.

BRIEF DESCRIPTION OF THE DRAWINGS

In order to more clearly illustrate the technical solutions in the embodiments of the disclosure or some implementations, the accompanying drawings required for use in the description of the embodiments or some implementations will be briefly described below, and the additional details or examples for describing the drawings should not be considered as limiting the scope of any of the invention creation of the disclosure, the presently described embodiments or manner.

DETAILED DESCRIPTION

Figure 1:
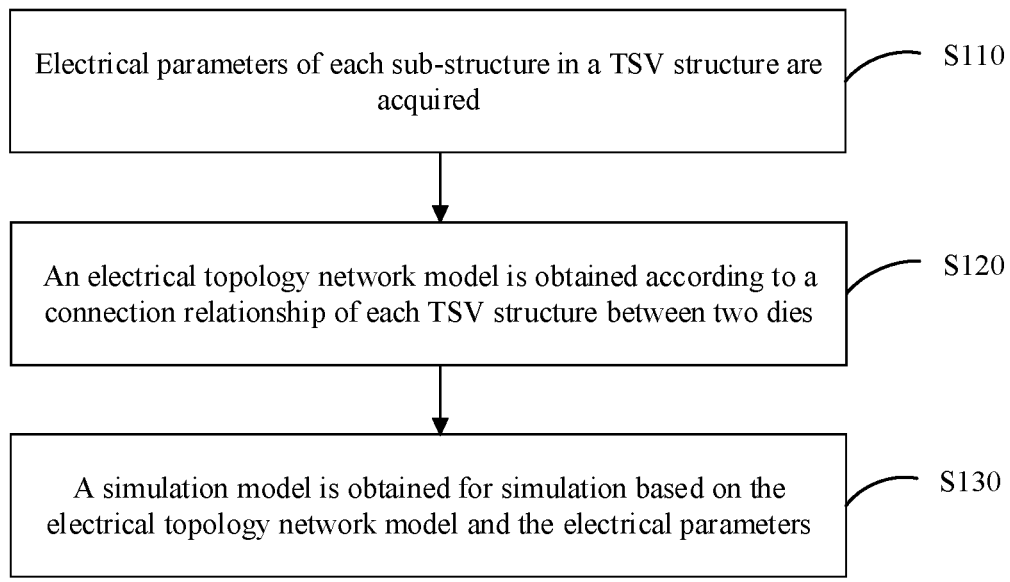
FIG. 1 illustrates a flowchart of a modeling method according to an embodiment of the disclosure.

In order to facilitate understanding of the disclosure, the disclosure will be described in more detail below with reference to the accompanying drawings. embodiments of the disclosure are given in the accompanying drawings. However, the disclosure may be implemented in many different manners, and is not limited to the embodiments described herein. Conversely, these embodiments are provided for the purpose of making the disclosure of the disclosure more thorough and comprehensive.

Unless otherwise defined, all technical and scientific terms used herein have the same meanings as those skilled in the art of the disclosure generally understand. The terms used herein in the specification of the disclosure are for the purpose of describing specific embodiments only and are not intended to limit the disclosure.

It should be understood that when an element or layer is referred to as being "on", "adjacent to", "connected to" or "coupled to" other elements or layers, it can be directly on other elements or layers, or can be adjacent to, connected to, or coupled to other elements or layers, or intervening elements or layers may be present. In contrast, when an element is referred to as being "directly on", "directly adjacent to", "directly connected to" or "directly coupled to" other elements or layers, there are no intervening elements or layers. It should be understood that although the terms "first", "second", "third", and the like may be used to describe various elements, components, regions, layers, doping types, and/or portions, these elements, components, regions, layers, doping types, and/or portions should not be limited by these terms. These terms are used only to distinguish one element, component, region, layer, doping type or portion from another element, component, region, layer, doping type or portion. Thus, without departing from the teachings of the disclosure, the first element, component, region, layer, doping type or portion discussed below may be represented as a second element, component, region, layer or portion. For example, the first doping type may be the second doping type, and similarly, the second doping type may be the first doping type. The first doping type and the second doping type are different doping types, for example, the first doping type may be a P type and the second doping type may be an N type, or the first doping type may be an N type and the second doping type may be a P type.

Spatial relationship terms such as "under . . . ", "below . . . ", "below", "underneath . . . ", "above", "on", etc., can be used to describe a relationship between one element or feature shown in the figure and other elements or features. It should be understood that in addition to the orientations shown in the figures, the spatial relationship terms also include different orientations of devices in use and operation. For example, if the device in the figures is turned over, elements or features described as "below other elements" or "under . . . " or "under" will be oriented "on" the other elements or features. Therefore, the exemplary terms "below . . . " and "under . . . " can include both an orientation of above and below. In addition, the device may also include other orientations (for example, rotated by 90 degrees or other orientations), and the space descriptors used herein are interpreted accordingly.

When used herein, the singular forms "one", "a(an)" and "the said/this" may also include plural forms, unless the context clearly dictates otherwise. It should also be understood that when the terms "composition" and/or "including" are used in this specification, the existence of the described features, integers, processes, operations, elements and/or components can be determined, but the presence or addition of one or more other features, integers, processes, operations, elements, components and/or groups are not excluded. Meanwhile, when used herein, the term "and/or" includes any and all combinations of related listed items.

The embodiments of the disclosure are described herein with reference to cross-sectional views which are schematic diagrams of embodiments (and intermediate structures) of the disclosure, so that variations in the illustrated shapes due to, for example, manufacturing techniques and/or tolerances may be contemplated. Accordingly, the embodiments of the disclosure should not be limited to specific shapes of the regions shown herein, but include shape deviations due to, for example, manufacturing techniques. For example, an implant region shown as rectangular generally has a rounded or curved feature and/or an implant concentration gradient at its edges, rather than a binary change from the implant region to the non-implant region. Likewise, the burial region formed by the implantation may result in some of the implants in the region between the burial region and the surface through which the implantation passes as it proceeds. Therefore, the regions illustrated in the figures are substantially schematic, their shape does not represent the actual shape of the region of the device, and does not limit the scope of the disclosure.

Some implementations cannot simulate a three-dimensional integrated circuit including a TSV structure, so the impact of the TSV structure on the three-dimensional integrated circuit cannot be known.

Referring to FIG. 1, the disclosure provides a modeling method which includes the following processes.

In S110, electrical parameters of each sub-structure in a TSV structure are acquired.

In S120, an electrical topology network model is obtained according to the connection relationship of each TSV structures between two dies.

In S130, a simulation model is obtained for simulation based on the electrical topology network model and the electrical parameters.

In the modeling method in the above embodiment, the electrical parameters of each sub-structure in the TSV structure and the entire electrical topology network model of each TSV structure between the two dies may be acquired, and the simulation model of the three-dimensional integrated circuit may be obtained based on the electrical topology network model and the electrical parameters, so that a three-dimensional integrated circuit including the TSV structure may be simulated, and the impact of the TSV structure on the whole three-dimensional integrated circuit can be known.

In S110, as illustrated in FIG. 1, the electrical parameters of each sub-structure in the TSV structure are acquired.

Figure 2:
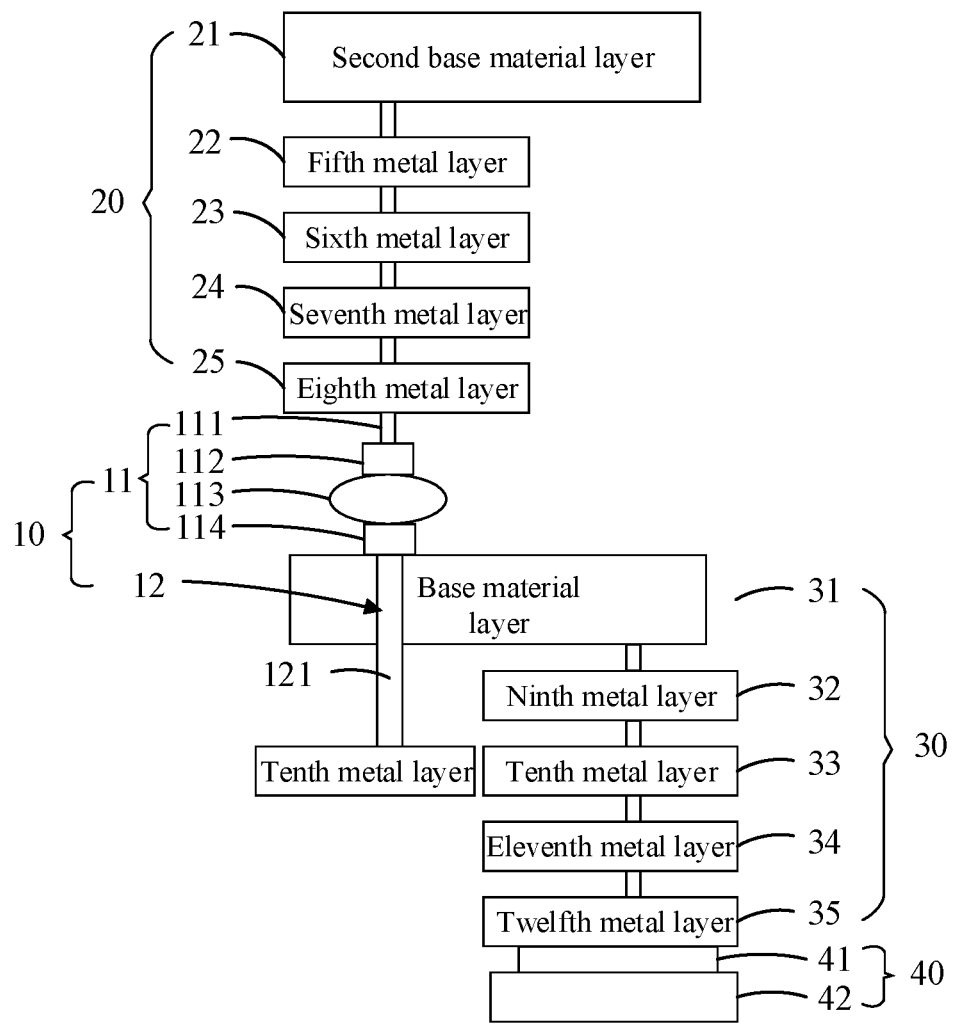
FIG. 2 illustrates a schematic diagram of an internal structure of a three-dimensional integrated circuit according to an embodiment of the disclosure.

In some examples, referring to FIG. 2, two or more dies may be included in a three-dimensional integrated circuit. Each die may be a chip of the same type, or may be a chip of different types. For example, the die may be a DRAM chip, and particularly, may be a DDR chip. Two of the dies are referred to as a first die 30 and a second die 20, respectively.

Each sub-structure may include a bump pad sub-structure 11 and a TSV sub-structure 12. An end of the bump pad sub-structure 11 may be electrically connected to the second die 20. Another end of the bump pad sub-structure 11 may be electrically connected to an end of the TSV sub-structure 12, and the first die 30 may be provided with a through via through which the TSV sub-structure 12 passes to electrically connect another end of the TSV sub-structure 12 to the first die 30. The electrical parameters may include electrical parameters of the bump pad sub-structure 11 and electrical parameters of the TSV sub-structure 12.

In some examples, referring to FIG. 2, the TSV structure may include a first metal layer 111, a second metal layer 112, a solder ball 113, a third metal layer 114, and a fourth metal layer 121 that are sequentially stacked. The bump pad sub-structure 11 may be configured to include a first metal layer 111 to a third metal layer 114, and the TSV sub-structure 12 may include a fourth metal layer 121.

In other examples, the layers in the TSV structure 10 may also be divided into other sub-structures different from the bump pad sub-structure 11 and the TSV sub-structure 12 according to actual requirements.

In some examples, referring to FIG. 2, the second die 20 may include a second base material layer 21 and a plurality of metal layers sequentially stacked. The first metal layer 111 of the TSV structure 10 may be electrically connected to any metal layer in the second die 20. For example, the second die 20 may include a fifth metal layer 22, a sixth metal layer 23, a seventh metal layer 24, and an eighth metal layer 25, which are sequentially stacked under the second base material layer 21. The first metal layer 111 may be electrically connected in contact with the eighth metal layer 25 such that an end of the bump pad sub-structure 11 may be electrically connected to the second die 20. Since the third metal layer 114 is in contact with the fourth metal layer 121, another end of the bump pad sub-structure 11 may be electrically connected to an end of the TSV sub-structure 12.

In some examples, referring to FIG. 2, the first die 30 may include a base material layer 31 and a plurality of metal layers which are sequentially stacked below the base material layer 31. A through via may be provided on the base material layer 31 through which the TSV sub-structure 12 passes, the fourth metal layer 121 of the TSV structure 10 may be electrically connected to any one of the metal layers in the first die 30. For example, the first die may include a ninth metal layer 32, a tenth metal layer 33, an eleventh metal layer 34, and a twelfth metal layer 35 which are sequentially stacked under the base material layer 31. The fourth metal layer 121 may be electrically connected in contact with the tenth metal layer 33 so that another end of the TSV sub-structure 12 may be electrically connected to the first die 30.

Figure 3:
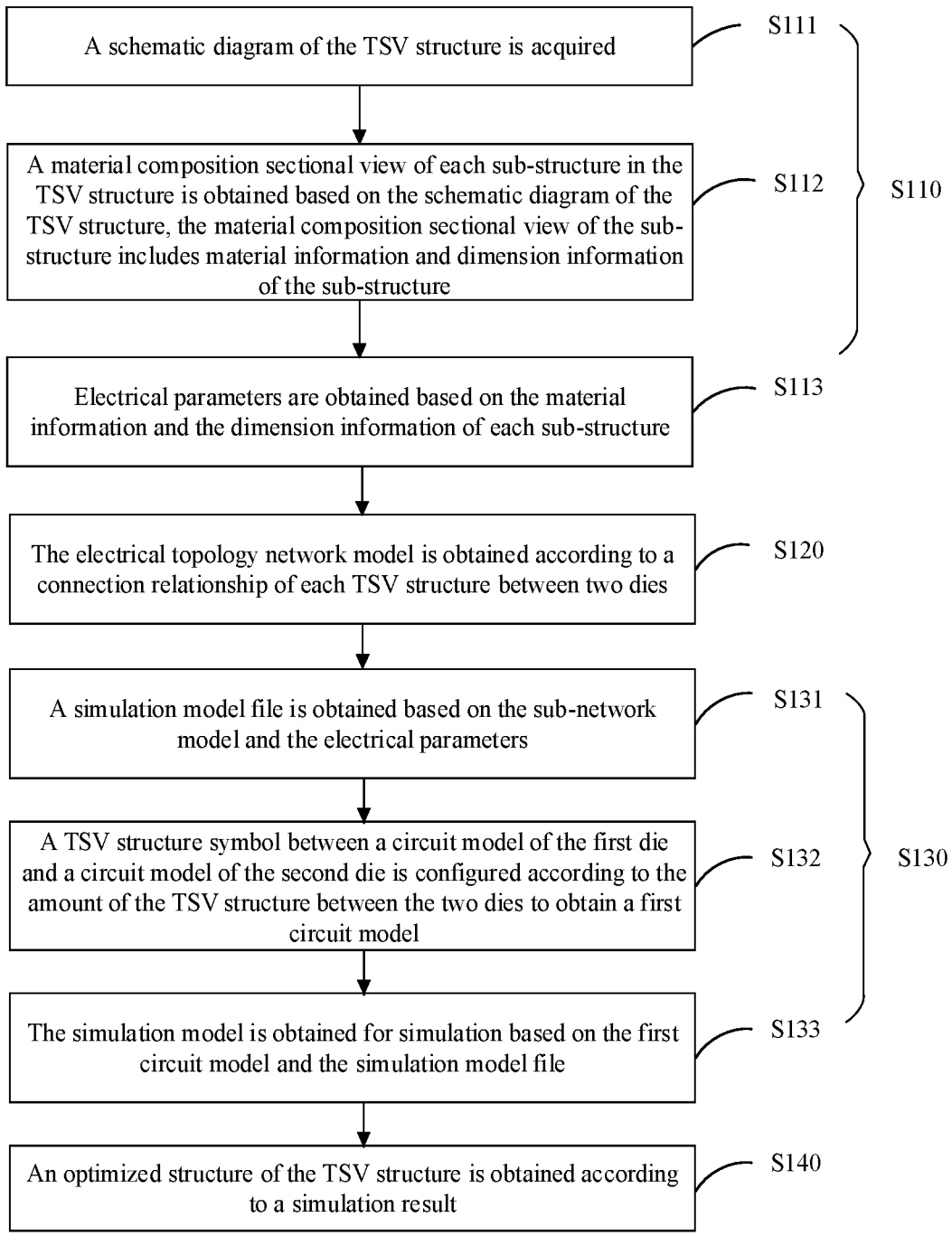
FIG. 3 illustrates a flowchart of a modeling method according to an embodiment of the disclosure.

In some examples, referring to FIG. 3, S110 specifically includes S111 to S113.

In S111: a schematic diagram of the TSV structure is acquired.

Specifically, an input device such as a mouse, a keyboard, or a touchscreen may be used by an operator to construct a schematic diagram of a TSV structure 10 between a die and a die (Die-to-Die), so as to acquire a schematic diagram of the TSV structure 10. The schematic diagram may be a three-dimensional schematic diagram or a planar schematic diagram. The amount of the TSV structure 10 between the die and the die may be one or more. When there are a plurality of TSV structures 10 between dies, the plurality of TSV structures 10 may be the same or may be different. The case that the plurality of TSV structures 10 are the same will be described hereinafter as an example.

In S112, a material composition sectional view of each sub-structure in the TSV structure is obtained based on the schematic diagram of the TSV structure, the material composition sectional view of the sub-structure includes material information and dimension information of the sub-structure.

Figure 4:
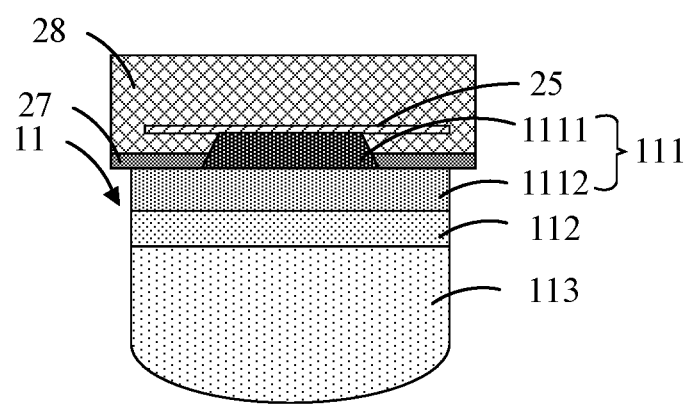
FIG. 4 illustrates a sectional view of a bump pad sub-structure according to an embodiment of the disclosure.
Figure 5:
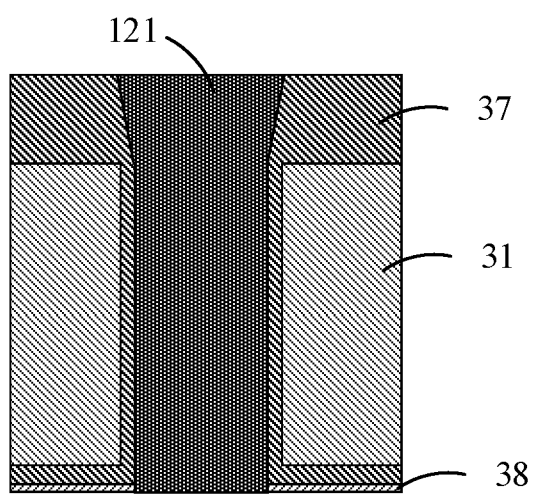
FIG. 5 illustrates a sectional view of a TSV sub-structure according to an embodiment of the present application.

Specifically, a material composition cross-sectional view of each sub-structure in the TSV structure 10 may be constructed according to a schematic diagram of the TSV structure 10. In this embodiment, the TSV structure 10 may include a bump pad sub-structure 11 and a TSV sub-structure 12. Referring to FIG. 4 and FIG. 5, a material composition cross-sectional view of the bump pad sub-structure 11 and a material composition cross-sectional view of the TSV sub-structure 12 are respectively obtained according to a schematic diagram of the TSV structure 10. The material composition cross-sectional view of the bump pad sub-structure 11 includes material information and dimension information of the bump pad sub-structure 11, and the material composition cross-sectional view of the silicon via sub-structure 12 includes material information and dimension information of the TSV sub-structure 12.

In some examples, referring to FIG. 2 and FIG. 4, in a material composition cross-sectional view of the bump pad sub-structure 11, the bump pad sub-structure 11 includes a first metal layer 111, a second metal layer 112, a solder ball 113, and a third metal layer 114 (not illustrated in FIG. 4) stacked sequentially. The first metal layer 111 may include a first copper layer 1111 and a second copper layer 1112. In the three-dimensional integrated circuit, the bottom periphery of the first copper layer 1111 may also be provided with a first insulating layer 27 which may include a first silicon nitride layer acting as quarantine insulation. The second die 20 may further include a first silicon oxide substrate 28 which may be positioned over the first insulating layer 27 and coated with an eighth metal layer 25. The second metal layer 112 may include a first nickel layer. The solder ball 113 may include a tin-silver alloy layer. The third metal layer 114 may include a second nickel layer. That is, the bump pad sub-structure may include a first copper layer 1111, a second copper layer 1112, a first nickel layer, a tin-silver alloy layer, and a second nickel layer stacked sequentially. The dimension information of each layer may be further included in the material composition cross-sectional view of the bump pad sub-structure 11, which is not illustrated in FIG. 4.

Referring to FIG. 2 and FIG. 5, in a material composition cross-sectional view of the TSV sub-structure 12, the TSV sub-structure 12 includes a fourth metal layer 121, and the fourth metal layer 121 may include a third copper layer. In the three-dimensional integrated circuit, the bottom periphery of the fourth metal layer 121 may also be provided with a second insulating layer 38 which includes a second silicon nitride layer and functions as a quarantine insulation. The first die 30 may further include a second silicon oxide substrate 37 which may be positioned over the second insulating layer 38 and coated with a part of the side of the fourth metal layer 121. The material composition cross-sectional view of the TSV sub-structure 12 may further include dimension information of each layer, which is not illustrated in FIG. 5.

In S113, the electrical parameters are obtained based on the material information and the dimension information of each sub-structure.

Specifically, the electrical parameters of each layer may be obtained based on the material information and the dimension information of each layer in each sub-structure in the TSV structure 10, and then the electrical parameters of the sub-structure may be calculated based on the electrical parameters of each layer in the sub-structure. In this embodiment, the electrical parameters of the bump pad sub-structure 11 may be obtained based on the material information and the dimension information of each of the first copper layer 1111, the second copper layer 1112, the first nickel layer, the tin-silver alloy layer, and the second nickel layer. In this embodiment, the electrical parameters of the third copper layer, that is, the electrical parameters of the TSV sub-structure 12, may be obtained based on the material information and the dimension information of the third copper layer.

In some examples, electrical parameters may include resistance parameters, capacitance parameters, and inductance parameters. For example, the resistance parameters of the bump pad sub-structure 11 and the capacitance parameters of the bump pad sub-structure 11 may be obtained based on the material information and the dimension information of each of the first copper layer 1111, the second copper layer 1112, the first nickel layer, the tin-silver alloy layer and the second nickel layer. The resistance parameters of the TSV sub-structure 12 and the capacitance parameters of the TSV sub-structure 12 may be obtained based on the material information and the dimension information of the third copper layer. Specifically, the first copper layer 1111 may have a width of 8-12 μm and a height of 2-6 μm. The second copper layer 1112 may have a width of 20-40 μm and a height of 2-6 μm. The first nickel layer may have a width of 20-40 μm and a height of 1-4 μm. The tin-silver alloy layer may have a width of 20-40 μm and a height of 4-9 μm. The second nickel layer may have a width of 20-40 μm and a height of 3-8 μm. The third copper layer may have a width of 4-8 μm and a height of 40-70 μm.

In some examples, the electrical parameters of the bump pad sub-structure 11 and the TSV sub-structure 12 may be calculated according to the following formula. Formula (1) is a formula for calculating resistance parameters, formula (2) is a formula for calculating inductance parameters, and formula (3) is a formula for calculating capacitance parameters. The parameters in formulas (1) to (3) may be calculated based on the material information of each layer and the dimension information of each layer in the bump pad sub-structure 11 and the TSV sub-structure 12. The resistance parameters, inductance parameters and capacitance parameters of each layer in each sub-structure may be calculated by using formulas (1) to (3), and then the resistance parameters, inductance parameters and capacitance parameters of each sub-structure may be calculated according to the electrical parameters of each layer in each sub-structure.

$$R = \rho L/S \tag{1}$$

In the formula (1), $\rho$ is the resistivity of a resistance, L is the length of the resistance, and S is the cross-sectional area of the resistance.

$$L = \mu_0 N^2 S/L \tag{2}$$

In the formula (2), $\mu_0$ is the magnetic permeability of a solenoid, N is the total amount of turns of the solenoid, S is the cross-sectional area of the solenoid, and L is the length of the solenoid.

$$C = \varepsilon A/d \tag{3}$$

In the formula (3), $\varepsilon$ is the dielectric constant of a capacitance, A is the area directly facing two plates of the capacitance, and d is the distance between the two plates of the capacitance.

In S120, the electrical topology network model is obtained according to a connection relationship of each TSV structure between the two dies.

Specifically, the amount of TSV structure 10 between the two dies may be one or more. When there are a plurality of TSV structures 10 between the two dies, the plurality of TSV structures 10 may be the same or different, and same TSV structures 10 may be connected to the two dies in a same manner. For example, the amount of the TSV structure 10 between the two dies is two, both of the two TSV structures 10 may include bump pad sub-structures 11 and TSV sub-structures 12, and the bump pad sub-structures 11 are in electrical contact with the second die 20 and the TSV sub-structures 12 are in electrical contact with the first die 30. The electrical topology network model is a general equivalent circuit model of the TSV structure(s) 10 between two dies.

Figure 6:
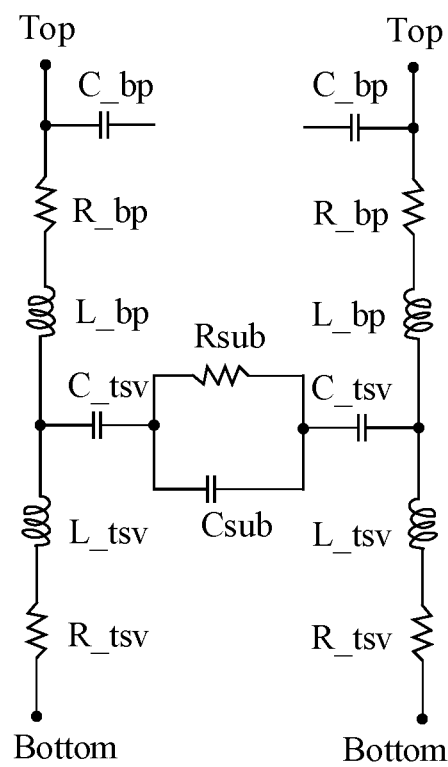
FIG. 6 illustrates a schematic diagram of an electrical topology network model according to an embodiment of the disclosure.

In some examples, referring to FIG. 6, when there are a plurality of TSV structures 10 between two dies, the plurality of TSV structures 10 are the same. The electrical topology network model includes a plurality of sub-network models, the amount of sub-network models is equal to the amount of the plurality of TSV structures 10. Each sub-network model may include a bump pad sub-resistance R_bp, a TSV resistance R_tsv, a bump pad sub-capacitance C_bp, a TSV capacitance C_tsv, a bump pad sub-inductance L_bp, and a TSV inductance L_tsv. The bump pad sub-resistance R_bp, the bump pad sub-inductance L_bp, the TSV inductance L_tsv, and the TSV resistance R_tsv may be sequentially connected in series between the second die and the first die. An end of the bump pad sub-capacitance C_bp may be connected between the second die 20 and the bump pad sub-resistance R_bp, and another end of the bump pad sub-capacitance C_bp may be connected to a preset distal end. The preset distal end may be infinitely distant. An end of the TSV capacitance C_tsv may be connected between the bump pad sub-inductance L by and the TSV inductance L_tsv, and another end of the TSV capacitance C_tsv may be connected to the TSV capacitance C_tsv in another sub-network model.

In this embodiment, by providing equivalent electrical elements of each sub-structure, an accurate simulation result may be obtained without a layout.

In some examples, the TSV capacitances C_tsv of two TSV structures may be connected between the base material resistance Rsub and the base material capacitance Csub. The base material resistance Rsub may be an equivalent resistance of the base material layer 31, and the base material capacitance Csub may be an equivalent capacitance of the base material layer 31. Two ends of the base material resistance Rsub and the base material capacitance Csub connected in parallel with each other may be respectively connected to the TSV capacitances C_tsv of the two TSV structures 10. The base material resistance Rsub is approximately infinitely large compared to the bump pad sub-resistance R_bp and the TSV resistance R_tsv, and the base material capacitance Csub is approximately infinitely small compared to the bump pad sub-capacitance C_bp and the TSV capacitance C_tsv. Therefore, the base material resistance Rsub and the base material capacitance Csub may be ignored in the electrical topology network model, thereby simplifying the electrical topology network model.

In S130, referring to S130 in FIG. 1, a simulation model is obtained for simulation based on the electrical topology network model and electrical parameters.

Specifically, the electrical parameters may include parameters of each equivalent electronic component in the electrical topology network model. The electrical topology network model is a general equivalent circuit model of each TSV structure 10 between two dies. The simulation model is a simulation model of a three-dimensional integrated circuit. Based on the electrical topology network model and electrical parameters, the simulation model of three-dimensional integrated circuit can be obtained for simulation, so that the impact of the TSV structure on the three-dimensional integrated circuit can be obtained.

In some examples, referring to FIG. 3, S130 specifically includes S131 to S133.

In S131, the simulation model file is obtained based on the sub-network model and the electrical parameters.

Specifically, in this embodiment, a case that the TSV structures 10 are the same, that is, the sub-network models are the same in the electrical topology network model, is taken as an example. In other examples, when the sub-network models are different, a corresponding simulation model file may be obtained based on the sub-network models and the corresponding electrical parameters. The simulation model file may define a parameter identifier and a parameter value of each equivalent electronic component located between a connection point (i.e., the top) of the electrical network topology model and the second die 20 and a connection point (i.e., the bottom) of the electrical network topology model and the first die 30 according to a predefined format. For example, the simulation model file may include a parameter identifier C_bp and a parameter value a of the bump pad sub-capacitance, a parameter identifier R by and a parameter value b of the bump pad sub-resistance, a parameter identifier L_bp and a parameter value c of the bump pad sub-inductance, a parameter identifier C_tsv and a parameter value d of the TSV capacitance, a parameter identifier L_tsv and a parameter value e of the TSV inductance, and a parameter identifier R_tsv and a parameter value f of the TSV resistance. The simulation model file may also calculate a resistance value tsv_r, an inductance value tsv_l, a capacitance value tsv_c, and the like of the TSV structure based on these parameter identifiers and parameter values.

In S132, a TSV structure symbol is configured between a circuit model of the first die and a circuit model of the second die according to the amount of the TSV structure between the two dies to obtain the first circuit model.

Figure 7:
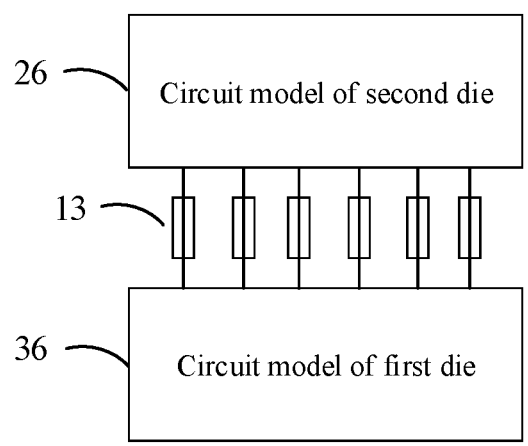
FIG. 7 illustrates a schematic diagram of a first circuit model according to an embodiment of the disclosure.

Specifically, referring to FIG. 7, the first circuit model is an equivalent circuit model of the three-dimensional integrated circuit. A TSV structure symbol 13 is configured between the circuit model 36 of the first die and the circuit model 26 of the second die according to the amount of the TSV structure 10 between the first die 30 and the second die 20 to obtain the first circuit model. Referring to FIG. 7, in the embodiment, there are six TSV structures 10 between the first die 30 and the second die 20. In this embodiment, the first die 30 may also be referred to as a master die, and the second die 20 may also be referred to as a slave die.

In S133, the simulation model is obtained for simulation based on the first circuit model and the simulation model file.

Specifically, the symbol of the TSV structure 10 in the first circuit model may be associated with the simulation model file, so that the first circuit model subjected to the association operation may be used for simulation, thereby obtaining the impact of the TSV structure 10 on the three-dimensional integrated circuit.

In this embodiment, the first circuit model includes the circuit model 36 of the first die, the circuit model 26 of the second die, and the TSV structure symbol 13 configured between the two circuit models. The simulation using the simulation model obtained from the first circuit model and the simulation model file is a simulation for the entire three-dimensional integrated circuit, and the impact of the TSV structure 10 on the entire three-dimensional integrated circuit may be reflected more in the simulation for the entire three-dimensional integrated circuit than a simulation only for the first die 30 or the second die 20.

Figure 8:
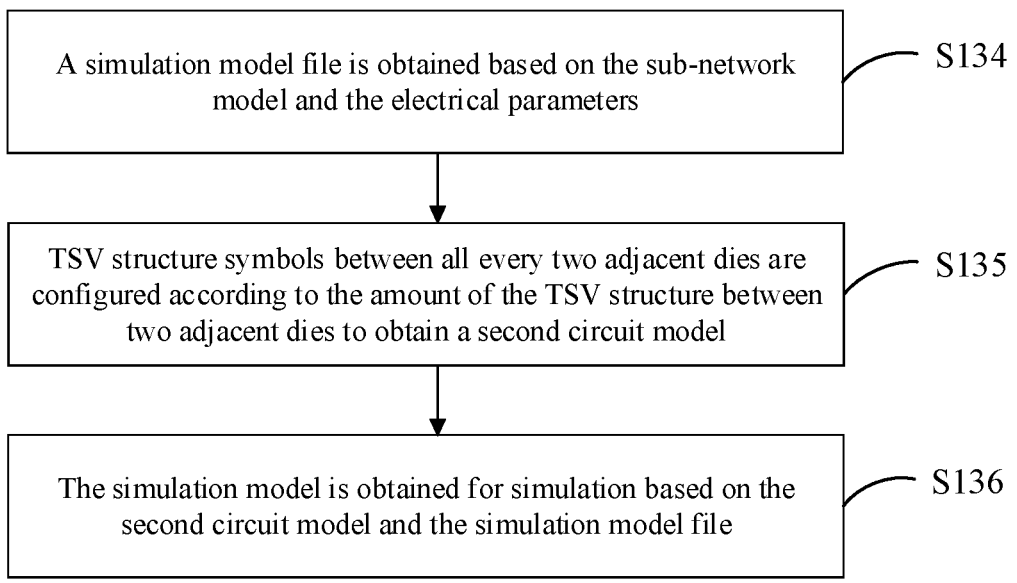
FIG. 8 illustrates a flowchart of specific processes in process S130 according to another embodiment of the disclosure.

In other examples, referring to FIG. 8, S130 specifically includes S134 to S136.

In S134, the simulation model file is obtained based on the sub-network model and the electrical parameters.

Specifically, S134 may be the same as the specific execution process of S131.

In S135, TSV structure symbols are respectively configured between all every two adjacent dies according to the amount of the TSV structure between two adjacent dies to obtain a second circuit model.

Figure 9:
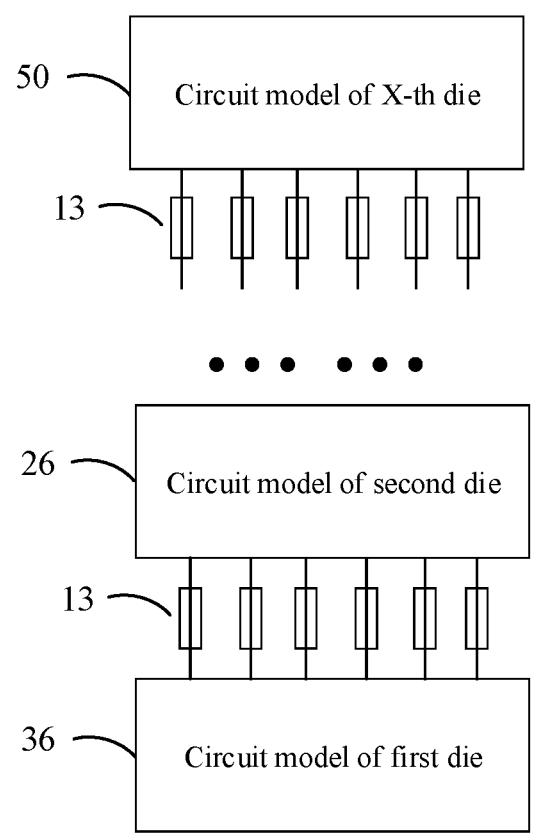
FIG. 9 illustrates a schematic diagram of a second circuit model according to an embodiment of the disclosure.

In this embodiment, the amount of dies is greater than two. The three-dimensional integrated circuit may include a first die 30, a second die 20 . . . , an X-th die, X is an integer greater than two. In this embodiment, the first die 30 may also be referred to as a master die, and the second die 20 to the X-th die may be referred to as slave dies. The amount of the TSV structure between every adjacent dies may be the same or different. Referring to FIG. 9, the circuit model 36 of the first die to the circuit model 50 of the X-th die may be constructed, and a TSV structure symbol 13 may be provided between all the circuit models of the two adjacent dies according to the amount of the TSV structure 10 to obtain the second circuit model. The second circuit model is an equivalent circuit model of the three-dimensional integrated circuit. Referring to FIG. 9, in the embodiment, the amount of the TSV structure 10 between every adjacent dies is all six.

In some examples, in the first circuit model and the second circuit model, the circuit model 36 of the first die to the circuit module 50 of the X-th die may be replaced with corresponding symbols, each system may be associated with information of the corresponding die, respectively.

In S136, the simulation model is obtained for simulation based on the second circuit model and the simulation model file.

Specifically, each TSV structure symbol 13 in the second circuit model may be associated with the simulation model file, so that the second circuit model subjected to the association operation can be used for simulation, thereby obtaining the impact of the TSV structure 10 on the three-dimensional integrated circuit.

In some examples, referring to FIG. 3, the modeling method may further include S140.

In S140, an optimized structure of the TSV structure is obtained according to a simulation result.

Specifically, the simulation result may include a current parameter, a voltage parameter and the like of each die in the three-dimensional integrated circuit. For example, when a voltage value of the die is small, it can be understood that a resistance value of the TSV structure 10 is large, so that factors affecting the resistance parameter of the TSV structure 10 may be adjusted. In this way, the TSV structure 10 may be optimized by the simulation result to avoid a negative impact of the TSV structure 10 on the function of the three-dimensional integrated circuit.

In some examples, S140 may include at least one of optimizing a height and/or width of the bump pad sub-structure 11, optimizing a width and/or height of the TSV sub-structure 12, optimizing a material composition and rate in the bump pad sub-structure 11, and optimizing a spacing between the respective TSV structures 10 between the two dies.

In some examples, referring to FIG. 2, the heights of any one or more layers of the first metal layer 111, the second metal layer 112, the solder ball 113, and the third metal layer 114 may be changed when the height of the bump pad sub-structure 11 is optimized. The width of any one or more layers of the first metal layer 111, the second metal layer 112, the solder balls 113, and the third metal layer 114 in the bump pad sub-structure 11 may be changed specifically when the width of the bump pad sub-structure is optimized. The width of the fourth metal layer 121 may be varied when the width of the TSV sub-structure is optimized. The height of the fourth metal layer 121 may be varied when the height of the TSV sub-structure is optimized. The material composition and ratio of any one or more layers of the first metal layer 111, the second metal layer 112, the solder ball 113, and the third metal layer 114 may be changed when the material composition and ratio in the bump pad sub-structure 11 are optimized. When optimizing the spacing between the TSV structures 10 between two dies, only the spacing between part of the TSV structures 10 may be changed; or the spacing between all TSV structures 10 may be changed at the same time so that the spacing between the TSV structures 10 is equal, which facilitates the simplification of the manufacturing process of the TSV structure 10.

In other examples, S140 may include re-determining a metal layer electrically connected to the TSV sub-structure.

Specifically, referring to FIG. 2, the first die 30 includes a base material layer 31 and a plurality of metal layers, and the plurality of metal layers are sequentially stacked below the base material layer 31. A through via may be provided on the base material layer 31 through which the TSV sub-structure 12 passes, and the TSV sub-structure 12 may be electrically connected to one of the metal layers. In the example of FIG. 2, the through via sub-structure 12 is electrically connected to the tenth metal layer 33. In other examples, it may be determined from the simulation structure that the metal layer electrically connected to the TSV sub-structure 12 is the ninth metal layer 32, the eleventh metal layer 34, or the twelfth metal layer 35. In this embodiment, re-determining a metal layer that is in contact with the TSV sub-structure 12 according to the simulation result is beneficial for minimizing a parasitic impact and laying out a three-dimensional integrated circuit. Furthermore, a layout of a metal layer that is in contact with the TSV sub-structure 12 may also be changed by changing the metal layer.

In some examples, referring to FIG. 2, the three-dimensional integrated circuit may also provide a bottom bump pad structure 40 at the bottom of the first die 30. The bottom bump pad structure 40 may include a thirteenth metal layer 41 and a fourteenth metal layer 42. When establishing the simulation model in the above embodiments, the model of the bottom bump pad structure 40 may also be considered to obtain the impact of the bump pad structure 40 on the three-dimensional integrated circuit. A specific manner of establishing a model of the bump pad structure 40 may be similar to that of the TSV structure 40, and details are not described herein.

It should be understood that although various processes in the flow charts of FIG. 1, FIG. 3 and FIG. 8 are displayed sequentially as indicated by arrows, the processes are not necessarily performed sequentially as indicated by the arrows. Unless explicitly stated herein, these processes are not strictly sequential and may be performed in other order. Moreover, at least a part of the processes in FIG. 1, FIG. 3 and FIG. 8 may include a plurality of processes or stages that are not necessarily performed at the same time, but may be performed at different times, and that are not necessarily performed sequentially, but may be performed alternately or alternately with at least a part of the processes or stages in the other processes or other processes.

Figure 10:
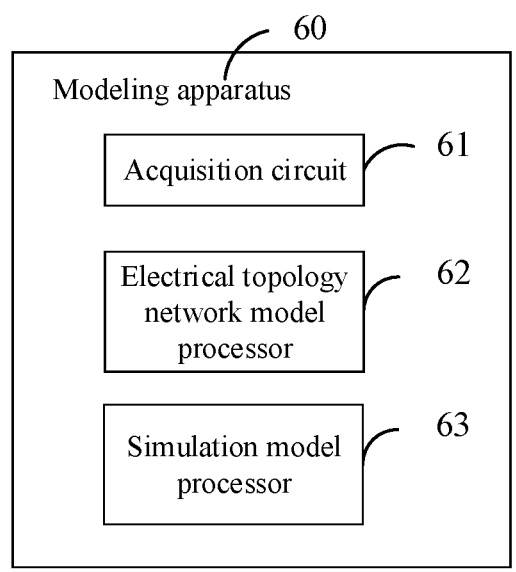
FIG. 10 illustrates a block diagram of a modeling apparatus according to an embodiment of the disclosure.

Please refer to FIG. 10, the disclosure further provides a modeling apparatus 60. The modeling apparatus 60 includes: an acquisition circuit 61, an electrical topology network model processor 62 and a simulation model processor 63. The acquisition circuit 61 is configured to acquire electrical parameters of each sub-structure in a TSV structure. The electrical topology network model processor 62 is configured to obtain an electrical topology network model according to a connection relationship of each TSV structure between two dies. The simulation model processor 63 is configured to obtain a simulation model for simulation based on the electrical topology network model and the electrical parameters.

The two dies are a first die and a second die, respectively. Each sub-structure may include a bump pad sub-structure and a TSV sub-structure. An end of the bump pad sub-structure may be electrically connected to the second die, another end of the bump pad sub-structure may be electrically connected to an end of the TSV sub-structure, and a through via may be provided on the first die to allow the TSV sub-structure to pass through to electrically connect another end of the TSV sub-structure to the first die. The electrical parameters may include the electrical parameters of the bump pad sub-structure and the electrical parameters of the TSV sub-structure.

In some examples, the acquisition circuit 61 may include: a schematic diagram acquisition unit, a sectional view acquisition unit, and an electrical parameter acquisition unit. The schematic diagram acquisition unit is configured to acquire a schematic diagram of the TSV structure. The sectional view acquisition unit is configured to obtain a sectional view of material composition of each sub-structure in the TSV structure according to a schematic diagram of the TSV structure. The composition sectional view of the sub-structure material may include material information and dimension information of the sub-structure. The electrical parameter acquisition unit is configured to obtain electrical parameters based on the material information and the dimension information of each sub-structure.

In some examples, electrical parameters may include resistance parameters, capacitance parameters, and inductance parameters.

In some examples, when there are a plurality of TSV structures between two dies, the plurality of TSV structures are the same, and the electrical topology network model includes a plurality of sub-network models, the amount of the plurality of sub-network models is equal to the amount of the plurality of TSV structures. Each of the plurality of sub-network models may include a bump pad sub-resistance, a TSV resistance, a bump pad sub-capacitance, a TSV capacitance, a bump pad sub-inductance and a TSV inductance. The bump pad sub-resistance, the bump pad sub-inductance, the TSV inductance and the TSV resistance may be sequentially connected in series between the second die and the first die. An end of the bump pad sub-capacitance may be connected between the second die and the bump pad sub-resistance, another end of the bump pad sub-capacitance may be connected to a preset distal end, an end of the TSV capacitance may be connected between the bump pad sub-inductance and the TSV inductance, and another end of the TSV capacitance may be connected to the TSV capacitance in another sub-network model.

In some examples, the simulation model processor 63 may include: a simulation model file processing unit, a TSV structure symbol processing unit, and a simulation model processing unit. In the simulation model file processing unit, the simulation model file may be obtained based on the sub-network model and the electrical parameters. In the TSV structure symbol processing unit, a TSV structure symbol may be configured between a circuit model of the first die and a circuit model of the second die according to the amount of the TSV structure between the two dies to obtain a first circuit model. In the simulation model processing unit, the simulation model may be obtained for simulation based on the first circuit model and the simulation model file.

In some examples, when the amount of dies is greater than two, the simulation model processor 63 may include: a simulation model file processing unit, a TSV structure symbol processing unit, and a simulation model processing unit. The simulation model file processing unit is configured to obtain a simulation model file based on the sub-network model and the electrical parameters. The TSV structure symbol processing unit is configured to configure the TSV structure symbol between all every two adjacent dies according to the amount of the TSV structure between two adjacent dies to obtain a second circuit model. The simulation model processing unit is configured to obtain the simulation model for simulation based on the second circuit model and the simulation model file.

In some examples, the bump pad sub-structure may include a first copper layer, a second copper layer, a first nickel layer, a tin-silver alloy layer, and a second nickel layer stacked sequentially. The TSV sub-structure may include a third copper layer. In the electrical parameter acquisition unit, the electrical parameters of the bump pad sub-structure may be obtained based on the material information and the dimension information of the first copper layer, the second copper layer, the first nickel layer, the tin-silver alloy layer and the second nickel layer. The electrical parameters of the TSV sub-structure may be obtained based on the material information and the dimension information of the third copper layer.

In some examples, an optimization module may be further included for obtaining an optimized structure of the TSV structure according to a simulation result.

In some examples, the optimization module is configured to optimize at least one of a height and/or width of the bump pad sub-structure, a width and/or height of the TSV sub-structure, a material composition and rate in the bump pad sub-structure, and a spacing between each TSV structure between the two dies.

In other examples, the first die may include a base material layer and a plurality of metal layers. The plurality of metal layers may be sequentially stacked below the base material layer. A through via may be provided on the base material layer through which a TSV sub-structure passes, and the TSV sub-structure may be electrically connected to one of the metal layers. The optimization module is configured to re-determine a metal layer electrically connected to the TSV sub-structure.

The disclosure further provides a computer device including a memory and a processor, the memory stores a computer program, the processor implements the processes in the method of any one of the above embodiments when executing the computer program.

The disclosure further provides a non-transitory computer-readable storage medium having a computer program stored thereon, and the computer program implements the processes in the method of any one of the above embodiments when executed by a processor.

Those of ordinary skill in the art will appreciate that all or part of the process of implementing the methods of the above embodiments may be accomplished by a computer program instructing relevant hardware, the computer program may be stored in a non-volatile computer readable storage medium, and the computer program may include the process of the embodiments of the above methods when executed. Any reference to a memory, storage, database, or other medium used in the embodiments provided in the disclosure may include at least one of non-volatile and volatile memory. Non-volatile memory may include read-only memory (ROM), magnetic tape, floppy disk, flash or optical memory, and the like. Volatile memory may include random access memory (RAM) or external cache memory. By way of illustration and not limitation, RAMs may be in various forms, such as static random access memory (SRAM) or dynamic random access memory (DRAM) or the like.

The technical features of the above embodiments may be arbitrarily combined, and for the sake of brevity of description, all possible combinations of the technical features in the above embodiments are not described, however, as long as the combinations of the technical features are not contradictory, they should be considered as the scope of this specification.

The above embodiments express only several implementations of the disclosure, which are described more specifically and in detail, but are not therefore understood as limiting the scope of the patent application. It should be noted that, for those of ordinary skill in the art, several modifications and improvements may be made without departing from the concepts of the disclosure, which all fall within the protection scope of the disclosure. Accordingly, the protection scope of the present patent application shall be subject to the appended claims.

What is claimed is:

1. A modeling method, comprising:
   acquiring electrical parameters of each sub-structure in a through silicon via (TSV) structure;
   obtaining an electrical topology network model according to a connection relationship of each TSV structure between two dies; and
   obtaining a simulation model for simulation based on the electrical topology network model and the electrical parameters.

2. The modeling method according to claim 1, wherein the two dies are a first die and a second die, respectively; each sub-structure comprises a bump pad sub-structure and a TSV sub-structure, wherein an end of the bump pad sub-structure is electrically connected to the second die, another end of the bump pad sub-structure is electrically connected to an end of the TSV sub-structure; a through via is provided on the first die to allow the TSV sub-structure to pass through to electrically connect another end of the TSV sub-structure to the first die; and the electrical parameters comprise electrical parameters of the bump pad sub-structure and electrical parameters of the electrical parameters of the TSV sub-structure.

3. The modeling method according to claim 2, wherein the acquiring electrical parameters of each sub-structure in a TSV structure comprises:
   acquiring a schematic diagram of the TSV structure;
   obtaining a material composition sectional view of each sub-structure in the TSV structure based on the schematic diagram of the TSV structure, wherein the material composition sectional view of the sub-structure comprises material information and dimension information of the sub-structure; and
   obtaining the electrical parameters based on the material information and the dimension information of each sub-structure.

4. The modeling method according to claim 3, wherein the electrical parameters comprise resistance parameters, capacitance parameters, and inductance parameters.

5. The modeling method according to claim 4, wherein when there are a plurality of TSV structures between the two dies, the plurality of TSV structures are the same, and the electrical topology network model comprises a plurality of sub-network models, the amount of the plurality of sub-network models is equal to the amount of the plurality of TSV structures;
   each of the plurality of sub-network models comprises a bump pad sub-resistance, a TSV resistance, a bump pad sub-capacitance, a TSV capacitance, a bump pad sub-inductance, and a TSV inductance, wherein the bump pad sub-resistance, the bump pad sub-inductance, the TSV inductance and the TSV resistance are sequentially connected in series between the second die and the first die, an end of the bump pad sub-capacitance is connected between the second die and the bump pad sub-resistance, another end of the bump pad sub-capacitance is connected to a preset distal end, an end of the TSV capacitance is connected between the bump pad sub-inductance and the TSV inductance, and another end of the TSV capacitance is connected to another TSV capacitance in the sub-network model.

6. The modeling method according to claim 5, wherein the obtaining a simulation model for simulation based on the electrical topology network model and the electrical parameters comprises:
  obtaining a simulation model file based on the sub-network model and the electrical parameters;
  configuring a TSV structure symbol between a circuit model of the first die and a circuit model of the second die according to the amount of the TSV structure between the two dies to obtain a first circuit model; and
  obtaining the simulation model for simulation based on the first circuit model and the simulation model file.

7. The modeling method according to claim 5, wherein when the amount of the dies is greater than two, the obtaining a simulation model for simulation based on the electrical topology network model and the electrical parameters comprises:
  obtaining a simulation model file based on the sub-network model and the electrical parameters;
  configuring TSV structure symbols between all every two adjacent dies according to the amount of the TSV structure between two adjacent dies to obtain a second circuit model; and
  obtaining the simulation model for simulation based on the second circuit model and the simulation model file.

8. The modeling method according to claim 3, wherein the bump pad sub-structure comprises a first copper layer, a second copper layer, a first nickel layer, a tin-silver alloy layer, and a second nickel layer sequentially stacked, the TSV sub-structure comprises a third copper layer;
  in the process of obtaining the electrical parameters based on the material information and the dimension information of each sub-structure, the electrical parameters of the bump pad sub-structure are obtained based on the material information and the dimension information of the first copper layer, the second copper layer, the first nickel layer, the tin-silver alloy layer, and the second nickel layer, and the electrical parameters of the TSV sub-structure are obtained based on the material information and the dimension information of the third copper layer.

9. The modeling method according to claim 8, further comprising:
  obtaining an optimized structure of the TSV structure according to a simulation result.

10. The modeling method according to claim 9, wherein the obtaining an optimized structure of the TSV structure according to a simulation result comprises:
  optimizing a height and/or a width of the bump pad sub-structure, optimizing a width and/or a height of the TSV sub-structure, optimizing a material composition and ratio in the bump pad sub-structure, and optimizing a spacing between each TSV structure between two of the dies.

11. The modeling method according to claim 9, wherein the first die comprises a base material layer and a plurality of metal layers, wherein the plurality of metal layers are sequentially stacked below the base material layer, a through via is provided on the base material layer to allow the TSV sub-structure to pass through, and the TSV sub-structure is electrically connected to one of the plurality of metal layers,
  wherein the obtaining an optimized structure of the TSV structure according to a simulation result comprises:
  re-determining a metal layer electrically connected to the TSV sub-structure.

12. A non-transitory computer-readable storage medium having a computer program stored thereon, and the computer program implementing the processes in the method according to claim 1 when executed by a processor.

13. A modeling apparatus, comprising:
  an acquisition circuit, configured to acquire electrical parameters of each sub-structure in a through silicon via (TSV) structure;
  an electrical topology network model processor, configured to obtain an electrical topology network model according to a connection relationship of each TSV structure between two dies; and
  a simulation model processor, configured to obtain a simulation model for simulation based on the electrical topology network model and the electrical parameters.

14. The modeling apparatus according to claim 13, wherein the two die sheets are a first die and a second die, respectively; each sub-structure comprises a bump pad sub-structure and a TSV sub-structure, wherein an end of the bump pad sub-structure is electrically connected to the second die, another end of the bump pad sub-structure is electrically connected to an end of the TSV sub-structure; a through via is provided on the first die to allow the TSV sub-structure to pass through to electrically connect another end of the TSV sub-structure to the first die; and the electrical parameters comprise electrical parameters of the bump pad sub-structure and electrical parameters of the TSV sub-structure.

15. The modeling apparatus according to claim 14, wherein the acquisition circuit is further configured to:
  acquire a schematic diagram of the TSV structure;
  obtain a material composition sectional view of each sub-structure in the TSV structure based on the schematic diagram of the TSV structure, wherein the material composition sectional view of the sub-structure comprises material information and dimension information of the sub-structure; and
  obtain the electrical parameters based on the material information and the dimension information of each sub-structure.

16. The modeling apparatus according to claim 15, wherein the electrical parameters comprise resistance parameters, capacitance parameters, and inductance parameters.

17. The modeling apparatus according to claim 16, wherein when there are a plurality of TSV structures between the two dies, the plurality of TSV structures are the same, and the electrical topology network model comprises a plurality of sub-network models, the amount of the plurality of sub-network models is equal to the amount of the plurality of TSV structures;
  each of the plurality of sub-network models comprises a bump pad sub-resistance, a TSV resistance, a bump pad sub-capacitance, a TSV capacitance, a bump pad sub-inductance, and a TSV inductance, wherein the bump pad sub-resistance, the bump pad sub-inductance, the TSV inductance and the TSV resistance are sequentially connected in series between the second die and the first die, an end of the bump pad sub-capacitance is connected between the second die and the bump pad sub-resistance, another end of the bump pad sub-capacitance is connected to a preset distal end, an end of the TSV capacitance is connected between the bump pad sub-inductance and the TSV inductance, and another end of the TSV capacitance is connected to another TSV capacitance in the sub-network model.

18. The modeling apparatus according to claim 17, wherein the simulation model processor is further configured to:

obtain a simulation model file based on the sub-network model and the electrical parameters;

configure a TSV structure symbol between a circuit model of the first die and a circuit model of the second die according to the amount of the TSV structure between the two dies to obtain a first circuit model; and obtain the simulation model for simulation based on the first circuit model and the simulation model file.

19. The modeling apparatus according to claim 17, wherein when the amount of the dies is greater than two, the simulation model processor is further configured to:

obtain a simulation model file based on the sub-network model and the electrical parameters;

configure TSV structure symbols between all every two adjacent dies according to the amount of the TSV structure between two adjacent dies to obtain a second circuit model; and obtain the simulation model for simulation based on the second circuit model and the simulation model file.

20. A computer device comprising a memory and a processor, the memory storing a computer program, the processor, when executing the computer program, implements operations comprising:

acquiring electrical parameters of each sub-structure in a through silicon via (TSV) structure;

obtaining an electrical topology network model according to a connection relationship of each TSV structure between two dies; and obtaining a simulation model for simulation based on the electrical topology network model and the electrical parameters.

* * * * *